United States Patent
Lee et al.

(10) Patent No.: US 7,135,413 B2
(45) Date of Patent: Nov. 14, 2006

(54) CLEANING SOLUTION FOR REMOVING DAMAGED PORTION OF FERROELECTRIC LAYER AND CLEANING METHOD USING THE SAME

(75) Inventors: Kwang-wook Lee, Kwacheon (KR); Im-soo Park, Seoul (KR); Kun-tack Lee, Suwon (KR); Young-min Kwon, Suwon (KR); Sang-rok Hah, Seoul (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 355 days.

(21) Appl. No.: 10/727,962

(22) Filed: Dec. 4, 2003

(65) Prior Publication Data

US 2004/0112870 A1 Jun. 17, 2004

Related U.S. Application Data

(62) Division of application No. 09/797,454, filed on Mar. 1, 2001, now abandoned.

(30) Foreign Application Priority Data

Jun. 27, 2000 (KR) ................. 2000-35705

(51) Int. Cl.
*H01L 21/302* (2006.01)
*C25F 3/30* (2006.01)
*C09K 13/00* (2006.01)

(52) U.S. Cl. ............... 438/745; 134/1.2; 134/41; 216/104; 252/79.1

(58) Field of Classification Search ........... 438/745; 134/1.2, 41; 216/104; 252/79.1; 510/175
See application file for complete search history.

(56) References Cited

U.S. PATENT DOCUMENTS 5,520,299 A * 5/1996 Belcher et al. ............ 216/66
6,143,706 A * 11/2000 Morinaga ............... 510/175

* cited by examiner

*Primary Examiner*—Nadine Norton
*Assistant Examiner*—Lynette T. Umez-Eronini
(74) *Attorney, Agent, or Firm*—F. Chau & Associates, LLC

(57) ABSTRACT

A cleaning solution for use in removing a damaged portion of a ferroelectric layer, and a cleaning method using the solution. The cleaning solution includes a fluoride, an organic acid with carboxyl group, an alkaline pH adjusting agent and water.

24 Claims, 4 Drawing Sheets

CLEANING SOLUTION FOR REMOVING DAMAGED PORTION OF FERROELECTRIC LAYER AND CLEANING METHOD USING THE SAME

CROSS-REFERENCE TO RELATED APPLICATION

This application is a divisional of U.S. application Ser. No. 09/797,454 filed on Mar. 1, 2001 now abandoned, the disclosure of which in its entirety is incorporated by reference herein, which claims priority to Korean Application 2000-35705 filed on Jun. 27, 2000.

BACKGROUND OF THE INVENTION

1. Technical Field

The present invention relates to a cleaning solution for use in removing a damaged portion of a ferroelectric layer, and a method for removing a damaged portion of a ferroelectric layer using the cleaning solution.

2. Discussion of Related Art

A ferroelectric random access memory (FRAM) can retain its contents without power for years. FRAM capacitors are kept in a charged state while the supply of power is suspended. During a patterning process for forming a FRAM capacitor, active components of etching gases used for the patterning, such as argon (Ar), fluorine (F) or chlorine (Cl), react with electrode materials or ferroelectric materials, thereby resulting in byproducts such as $PbO_2$, $ZrO_2$, $TiO_2$ or $TiO_3$, on the surface of a ferroelectric layer. As a result, the ferroelectric layer is damaged by the byproducts. The damaged ferroelectric layer serves as a leakage current path between upper and lower electrodes, thereby degrading the electrical properties of the FRAM capacitor.

In the manufacture of the FRAM capacitor, annealing is carried out so as to provide the FRAM capacitor with a stable perovskite structure. However, even after the annealing is completed, a pyrochlore structure, which is a semi-stable phase, appears from the top of the ferroelectric layer to a predetermined depth. If an upper electrode layer is deposited over the ferroelectric layer having the pyrochlore structure, a desirable FRAM capacitor having superior performance cannot be obtained. In this aspect, the ferroelectric layer having the pyrochlore structure is regarded as a kind of damaged layer, relative to the whole ferroelectric layer with the perovskite structure.

Thus, there is a need to perform a cleaning step for removing such a ferroelectric layer having the semi-stable pyrochlore structure and a portion of the ferroelectric layer that is damaged during an etching process in the manufacture of the FRAM capacitor. A conventional cleaning solution used in the cleaning step includes hydrogen fluoride (HF) diluted with an alcoholic solvent, such as methanol, ethanol or isopropyl alcohol, in a predetermined ratio. However, because the alcoholic solvent of the cleaning solution is highly volatile, the alcoholic solvent evaporates with time, hence the cleaning (etching) capability of the cleaning solution cannot be kept constant, thereby shortening the lifetime of the cleaning solution. Another disadvantage in using the conventional cleaning solution lies in that after the cleaning is completed, a further rinsing step with isopropyl alcohol (IPA) is needed before a rinsing step with deionized water. This is because the rinsing step with deionized water is insufficient to completely remove the cleaning solution from the surface of the substrate, which causes corrosion of the substrate.

Therefore, a need exists for providing a cleaning solution capable of selectively removing a damaged portion of a ferroelectric layer, and has a consistent cleaning capability for a longer period of time.

A method is also needed for selectively removing a damaged portion of a ferroelectric layer using the cleaning solution.

SUMMARY OF THE INVENTION

According to an aspect of the present invention, a cleaning solution is provided that is capable of selectively removing a damaged portion of a ferroelectric layer, the cleaning solution comprising a fluoride, an organic acid with carboxyl group, an alkaline pH adjusting agent, and water. It is preferable that the pH of the cleaning solution is in the range of about 4.5 to about 6.0.

It is preferable that the fluoride comprises hydrogen fluoride, hydroboron tetrafluoride or ammonium fluoride, the organic acid comprises formic acid, acetic acid or citric acid, and the alkaline pH adjusting agent comprises ammonium hydroxide, potassium hydroxide, tetramethylammonium hydroxide or tetraethylammonium hydroxide.

It is preferable that the fluoride content is from about 0.01% to about 1% by weight, the content of the organic acid with carboxyl group is from about 1% to about 50% by weight, and the content of the alkali pH adjusting agent is from about 0.25% to about 15% by weight based on the total weight of the cleaning solution.

According to another aspect of the present invention, there is provided a method of selectively removing a damaged portion of a ferroelectric layer with a cleaning solution, the method comprising: providing an integrated circuit substrate having an exposed ferroelectric layer with a damaged portion; and making the exposed ferroelectric layer contact the cleaning solution, the cleaning solution including a fluoride, an organic acid with carboxyl group, an alkaline pH adjusting agent and water.

It is preferable that the exposed ferroelectric layer includes the surface of the ferroelectric layer which is passed through annealing after deposition on an integrated circuit substrate. Preferably, the exposed ferroelectric layer is contacted with the cleaning solution to etch back the ferroelectric layer by a thickness of between about 100 Å to about 500 Å from the top of the ferroelectric layer.

It is preferable that the exposed ferroelectric layer is interposed between upper and lower electrode layers, and the method further comprises forming a capacitor by patterning the upper electrode layer, the ferroelectric layer and the lower electrode layer before contacting the exposed ferroelectric layer with the cleaning solution.

Therefore, a cleaning solution according to the present invention is able to effectively remove a damaged portion of the ferroelectric layer, while maintaining a consistent cleaning capability for a longer period of time.

These and other aspects, features and advantages of the present invention will described or become apparent from the following detailed description of the preferred embodiments, which is to be read in connection with the accompanying drawings.

DETAILED DESCRIPTION OF PREFERRED EMBODIMENTS

Figure 1:
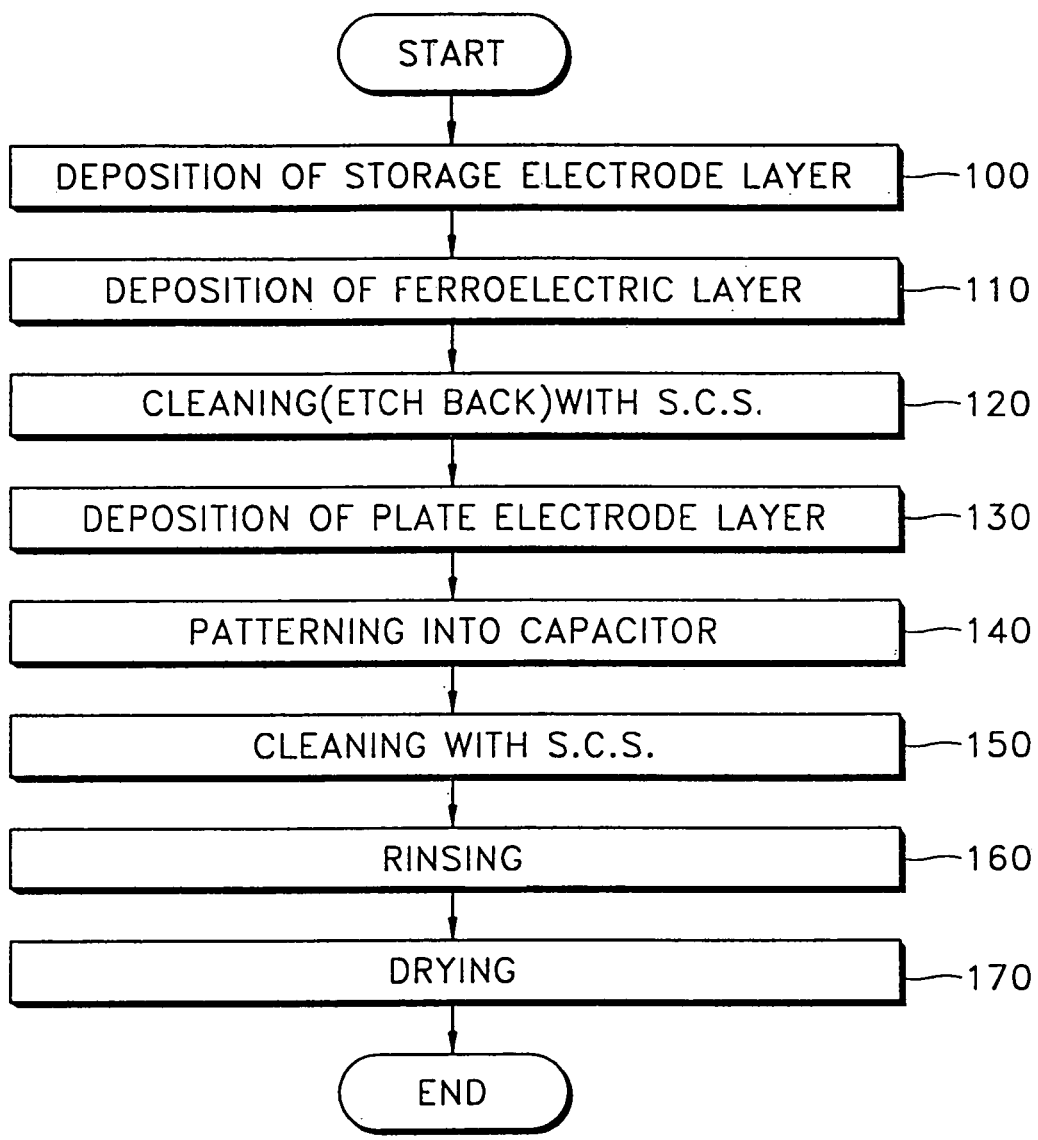
FIG. 1 is an exemplary flowchart illustrating use of a cleaning solution according to an aspect of the present invention in the manufacture of a ferroelectric random access memory (FRAM) capacitor.

A cleaning solution and a cleaning method using the cleaning solution according to the present invention will now be described more fully. The cleaning solution according to an aspect of the present invention, which for convenience will be referred to as Samsung selective Cleaning Solution or "S.C.S", preferably includes a fluoride, an organic acid with carboxyl group, an alkaline pH adjusting agent, and water.

The S.C.S. includes a range of about 0.01% to about 1% by weight fluoride, about 1% to about 50% by weight organic acid with carboxyl group, about 0.25% to about 15% by weight alkaline pH adjusting agent, and a remaining balance of water.

In terms of efficiency in the manufacture of semiconductor devices, a cleaning time of 30 minutes or less is desirable. If the fluoride content is less than 0.01% by weight, it is impossible to completely remove a damaged portion of a ferroelectric layer within the maximum desired period of cleaning time. However, if the fluoride content exceeds 1% by weight, the etching rate over the damaged ferroelectric layer is so high that accurate controlling of the cleaning process is difficult.

If the organic acid content is less than 1% by weight, the cleaning capability with respect to the damaged portion of the ferroelectric layer decreases. Also, for a greater cleaning efficiency and processing margin, it is desirable that the organic acid content does not exceed about 50% by weight. The pH adjusting agent content varies depending on the fluoride and organic acid contents. Preferably, the pH adjusting agent content is in the range of between about 0.25% to about 15% by weight based on the total weight of S.C.S.

It is preferable that the pH level of the S.C.S is about 6.6 or less. If the pH level of the S.C.S is higher than about 6.6, the damaged portion of the ferroelectric layer cannot be completely removed within the maximum desired cleaning time. However, if the S.C.S exhibits strong acidity less than about pH 4.5, electrode layers formed above and below the ferroelectric layer are damaged. In a pH range from about 6.0 to about 6.6, the damaged portion of the ferroelectric layer can be removed with the S.C.S., but the etching selectivity with respect to the damaged portion of the ferroelectric layer drops. Therefore, to selectively remove the damaged portion of the ferroelectric layer at a constant etching rate without removing an undamaged portion, it is more preferable that the pH of the S.C.S. ranges from about 4.5 to about 6.0.

Preferably, the fluoride for use in the cleaning solution is hydrogen fluoride (HF), hydroboron tetrafluoride ($HBF_4$) or ammonium fluoride ($NH_4F$).

Preferably, the organic acid with carboxyl group is formic acid (HCOOH), acetic acid ($CH_3COOH$) or citric acid ($C_3H_4(OH)(COOH)_3$).

Preferably, the alkaline pH adjusting agent is ammonium hydroxide ($NH_4OH$), potassium hydroxide (KOH), tetramethyl ammonium hydroxide ($(CH_3)_4NH_4OH$), or tetraethyl ammonium hydroxide ($(CH_3CH_2)_4NH_4OH$).

The type of ferroelectric layer to which the S.C.S. can be applied, includes a STO ($SrTiO_3$) layer, a BST $(Ba,Sr)TiO_3$) layer, a PZT ($Pb(Zr_xTi_{1-x})O_3$ layer, and a PLZT (La-doped PZT) layer.

The main cause of damage to the ferroelectric layer are oxides of the constituent elements of the ferroelectric layers. These oxides, such as $PbO_2$, $ZrO_2$, $TiO_2$, $TiO_3$, BaO, or SrO, can be removed by the following method.

Fluorine ion ($F^-$) derived from fluoride, which has a strong reducing power, reduces the metal of a metallic oxide. In addition to the fluorine ion, ammonium and hydroxy ions originating from a pH adjusting agent and hydrogen ions dissociated from an organic acid also serve as reductants. Reduction of a metallic oxide (for example, titanium oxide ($TiO_3$)) by a fluoride (for example, hydrogen fluoride (HF), is expressed, for example, by the following reaction scheme:

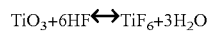

$$TiO_3 + 6HF \leftrightarrow TiF_6 + 3H_2O$$

The reduced metallic component is dissolved in the organic acid by chelation with the organic acid having a carboxyl group, or in water that is a polar solvent contained in the cleaning solvent.

The organic acid according to the present invention, which serves as a reductant and a dissolving agent as described previously, protects an exposed capacitor electrode layer formed on the surface of an integrated circuit substrate, for example, an iridium (Ir), ruthenium (Ru) or platinum (Pt) layer, or an iridium oxide ($IrO_2$) or ruthenium oxide ($RuO_2$) layer, from corrosion or damage. In particular, a metallic oxide layer is spontaneously formed on the exposed electrode layer. As the metallic oxide layer is reduced into metal ions by the reaction with a reductant contained in the S.C.S, the organic acid forms a chelate complex with the metal ions. As a result, the exposed surface of the electrode layer is covered with the stable chelate complex, so that the exposed electrode layer is protected from corrosion or damage.

The pH adjusting agent according to the present invention is used for appropriately adjusting the pH level of the S.C.S, such that the etching selectivity with respect to the damaged portion of the ferroelectric layer increases while keeping the reducing power of the fluoride constant. In addition, the pH adjusting agent properly adjusts the pH of the S.C.S. to minimize the damage of the electrode layer. Considering these aspects, a suitable pH level of the S.C.S adjusted by the pH adjusting agent preferably ranges from about 4.5 to about 6.0.

A method for manufacturing a FRAM capacitor using the S.C.S. according to the present invention will be described with reference to FIG. 1. A storage electrode layer, which is electrically connected to a source region, is formed over a semiconductor substrate with a sub structure (step 100). The storage electrode layer may be formed of the platinum group metals including platinum (Pt), iridium (Ir), ruthenium (Ru) and rhodium (Rh). To improve the fatigue characteristic, the storage electrode layer may be formed of a metallic oxide layer, such as an $IrO_2$, $RuO_2$, $RhO_2$ or $LaSrCoO_3$ layer.

Next, a ferroelectric layer is formed over the storage electrode layer (step 110). The ferroelectric layer may be formed of a STO, BST, PZT or PLZT layer. The ferroelectric layer having a desired thickness can be formed by a single deposition and annealing, or alternatively, deposition to a predetermined thickness and a baking process can be repeated until a ferroelectric layer having a desired thickness is formed. In the latter case, after the ferroelectric layer reaches the desired thickness, annealing is carried out on the resultant structure. The deposition and baking processes can be repeated to make the composition and properties of the ferroelectric layer uniform. Although the ferroelectric layer is completed through these processes, a semi-stable pyrochlore phase also forms on the top of the ferroelectric layer. To remove the damaged portion having the semi-stable pyrochlore phase from the ferroelectric layer, the ferroelectric layer is made to contact with the S.C.S. according to the present invention (step 120). Step 120 is performed for a predetermined time period in which the ferroelectric layer can be etched back between about 100 Å to about 500 Å. Preferably, step 120 is carried out for about 30 to 600 seconds, but more preferably, for about 30 to about 180 seconds. In step 120, the substrate with the ferroelectric layer may be dipped in a S.C.S. bath or the S.C.S may be spread over the ferroelectric layer.

If the ferroelectric layer has a whole perovskite structure through the annealing performed after the deposition, the step 120 of removing a damaged portion of the ferroelectric layer using the S.C.S. can be omitted.

After the damaged portion of the ferroelectric layer has been removed, a plate electrode layer is formed over the resultant structure (step 130). The plate electrode layer may be formed of the same material used for the storage electrode, i.e., a Pt group metal or an oxide of the Pt group metal.

Next, the plate electrode layer, the ferroelectric layer and the storage electrode layer are consequently patterned to form a capacitor (step 140). This patterning is carried out by dry etching using an etching gas containing, for example, Ar, F or Cl. During the patterning, active components of the etching gas, such as, for example, Ar, F or Cl, react with the electrode materials or ferroelectric material, thereby resulting in byproducts such as, for example, $PbO_2$, $ZrO_2$, $TiO_2$ or $TiO_3$, on the sidewalls of the ferroelectric layer, which cause damage to sidewalls of the ferroelectric layer.

Subsequently, the substrate with the FRAM capacitor is cleaned with the S.C.S. to remove a damaged portion of the ferroelectric layer (step 150).

Unlike a conventional cleaning solution, the inventive S.C.S. does not contain a highly volatile alcoholic solvent. Thus, even though cleaning is performed several times with the inventive S.C.S., there are no problems associated with a changing volume or composition ratio of the S.C.S. due to evaporation of an alcoholic solvent. As a result, the cleaning efficiency of S.C.S. is consistent. Furthermore, when the inventive cleaning solution is utilized, the cleaning process can be performed at low temperatures of 60° C. or less, and particularly, at room temperature.

In addition, an S.C.S. solution according to the present invention does not cause corrosion or damage of electrode layers, so that contact with the substrate for a longer time period is allowed. To maximize the process efficiency and the complete removal of the damaged portion of the ferroelectric layer, the substrate is preferably contacted with the S.C.S. solution for about 30 to about 600 seconds, but more preferably, for about 30 to about 180 seconds.

After the cleaning process is completed, the substrate is rinsed with deionized water so as to remove the S.C.S. in which the damaged portion separated from the ferroelectric layer is dissolved (step 160). The rinsing process may be performed through two stages as needed. Lastly, the substrate is dried by spin drying or by using isopropyl alcohol to evaporate deionized water from the surface of the substrate, thereby resulting in a complete FRAM capacitor (step 170). After the drying is completed, the resultant substrate is transferred for a next step that is required to integrate a circuit on the substrate.

Because the inventive S.C.S. is an aqueous solution, a single rinse with deionized water is sufficient to completely remove the S.C.S. from the surface of the substrate. Thus, a further rinsing process with isopropyl alcohol (IPA), which was required when using a conventional cleaning solution, is unnecessary when using the inventive S.C.S. In addition, the inventive S.C.S. exhibits a high etching rate and a high etching selectivity with respect to a damaged portion of the ferroelectric layer, so that the damaged portion of the ferroelectric layer can be effectively removed, thereby improving the electrical properties of the FRAM capacitor.

The present invention will be described in greater detail by means of the following examples. The following examples are for illustrative purposes and are not intended to limit the scope of the invention.

EXPERIMENTAL EXAMPLE 1

Determination of Appropriate Hydrogen Fluoride (HF) Content

To determine an appropriate HF content in the S.C.S., samples of the S.C.S. each containing 0.1%, 0.2%, 0.3% and 0.4% HF by weight based on the total weight of the S.C.S were prepared. Two S.C.S. samples were prepared for each HF concentration. A $(Pb(Zr_xTi_{1-x})O_3$ (PZT) layer was deposited to a thickness of 500 Å on 8 substrates, and baked. This deposition and baking was repeated once more, and an annealing process was carried out at 350° C. or more on the resultant structure, thereby forming a PZT layer having a thickness of 1000 Å on the substrates. Plasma etching was performed on four substrates with a gas mixture containing halogen gas, $CF_x$ gas and $O_2$ gas, which caused damage to the PZT layers. Next, the four substrates with the damaged PZT layers were immersed for 30 seconds in the respective S.C.S samples containing HF at the four different concentrations. Also, the other four substrates with the whole PZT layers were immersed for 30 seconds in the respective S.C.S samples containing HF at the four different concentrations. After the cleaning in the S.C.S. samples, the etching rate of the PZT layer was measured for the eight substrates. The results are shown in FIG. 2.

Figure 2:
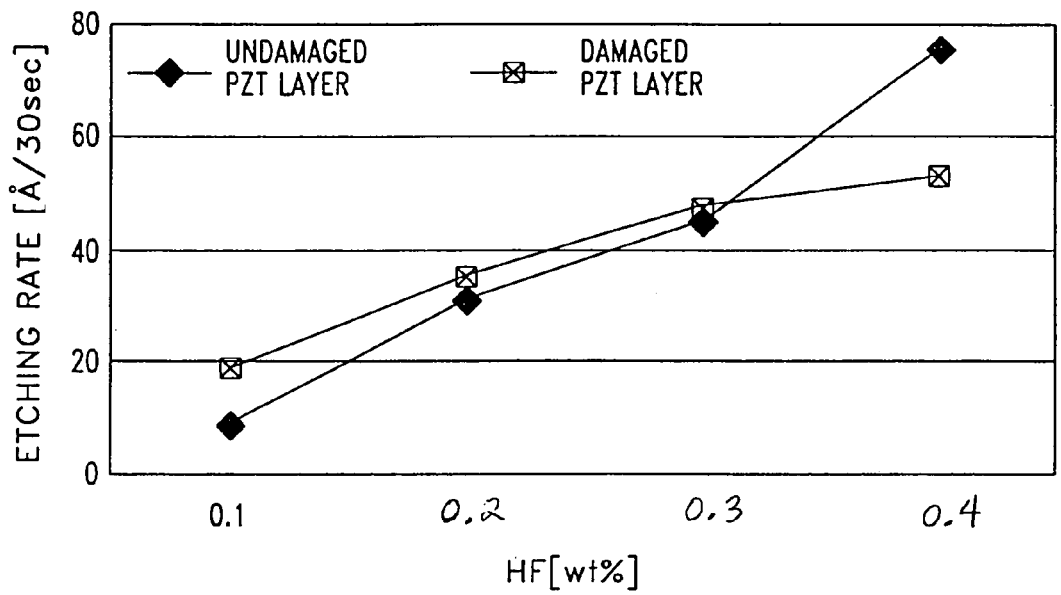
FIG. 2 is an exemplary graph showing etching rate variations with respect to hydrogen fluoride content in the cleaning solution according to an aspect of the present invention, which were measured to determine an appropriate hydrogen fluoride content of the cleaning solution.

As shown in FIG. 2, the damaged PZT layer can be selectively removed at 0.3% or less by weight HF.

EXPERIMENTAL EXAMPLE 2

Determination of Appropriate pH Level

To determine an appropriate pH level of the S.C.S. at which it exhibits the full cleaning capability, various S.C.S. samples at pH levels of 4.5, 5.5, 6.0, and 9.0 were prepared. Two S.C.S. samples were prepared for each pH level. Four substrates with a damaged PZT layer and four substrates with a whole PZT layer were prepared in the same way as in Experimental Example 1 above. A substrate with the damaged PZT layer and a substrate with the undamaged PZT layer were immersed for 30 seconds in the two S.C.S. samples at the same pH level, respectively. After the cleaning in the S.C.S. samples, the etching rate with respect to the PZT layer was measured. The results are shown in FIG. 3.

Figure 3:
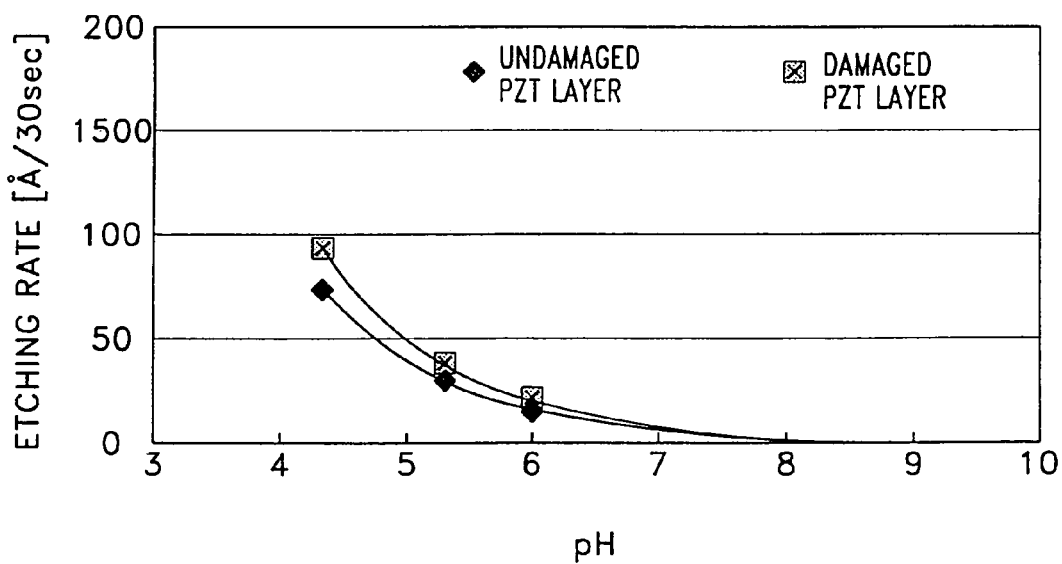
FIG. 3 is an exemplary graph showing etching rate variations with respect to a pH of the cleaning solution according to an aspect of the present invention, which were measured to determine an appropriate pH level of the cleaning solution.

As shown in FIG. 3, as the pH of the S.C.S. changes from weak acidity to weak alkalinity, the etching rate of the S.C.S solution with respect to the PZT layer decreases. It can be noticed that the pH level of the S.C.S is preferably about 4.5 to about 6.0 to allow an adjustment of the etching rate and to selectively remove the damaged PZT layer in the cleaning step.

EXPERIMENTAL EXAMPLE 3

Determination of Appropriate Cleaning Time

Figure 4:
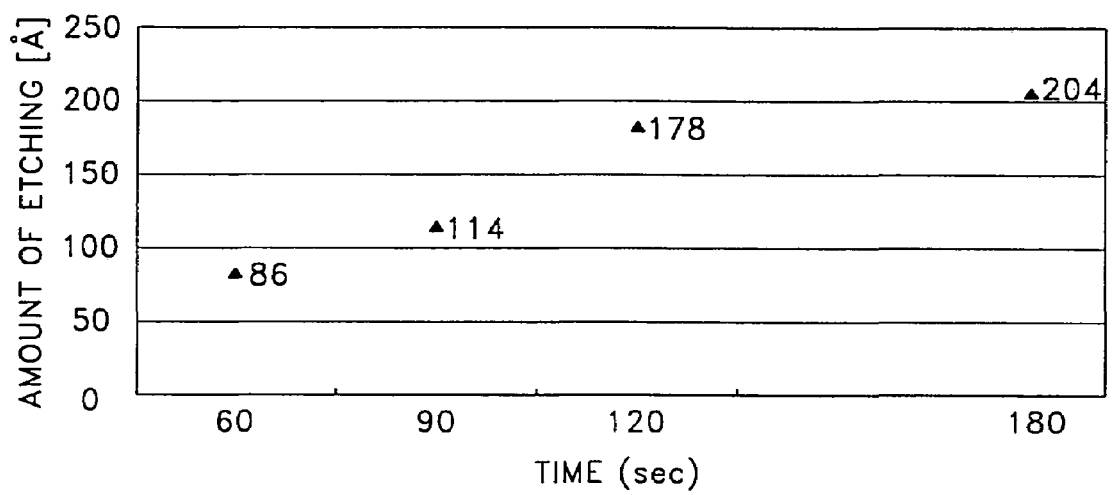
FIG. 4 is an exemplary graph showing etching rate variations with respect to cleaning time for determining an appropriate cleaning time for a cleaning process using the cleaning solution according to an aspect of the present invention.

An appropriate cleaning time was determined using an S.C.S sample whose composition was optimized based on the results from Experimental Examples 1 and 2 above. Four substrates with a damaged PZT layer were prepared in the same way as in Experimental Example 1. Next, the four substrates were immersed in the optimized S.C.S samples for 60, 90, 120 and 180 seconds, respectively. The amount of etching was measured for each substrate. The results are shown in FIG. 4.

Considering that the thickness of the PZT layer damaged after the formation of a capacitor is usually about 100 Å, it can be noticed that the appropriate cleaning time is between about 80 to about 100 seconds, and more preferably, about 90 seconds.

EXPERIMENTAL EXAMPLE 4

Measurement of the Lifetime of the S.C.S

To measure the storage stability (i.e., the "lifetime") of the S.C.S. according to the present invention, four S.C.S. samples were prepared and left for 0, 4, 8 and 16 hours, respectively. Four substrates with a damaged PZT layer were prepared in the same way as in Experimental Example 1, and immersed in the respective S.C.S. samples for 60 seconds. After the cleaning in the S.C.S. samples, the etching rate was measured for each sample. The results are shown in FIG. 5.

Figure 5:
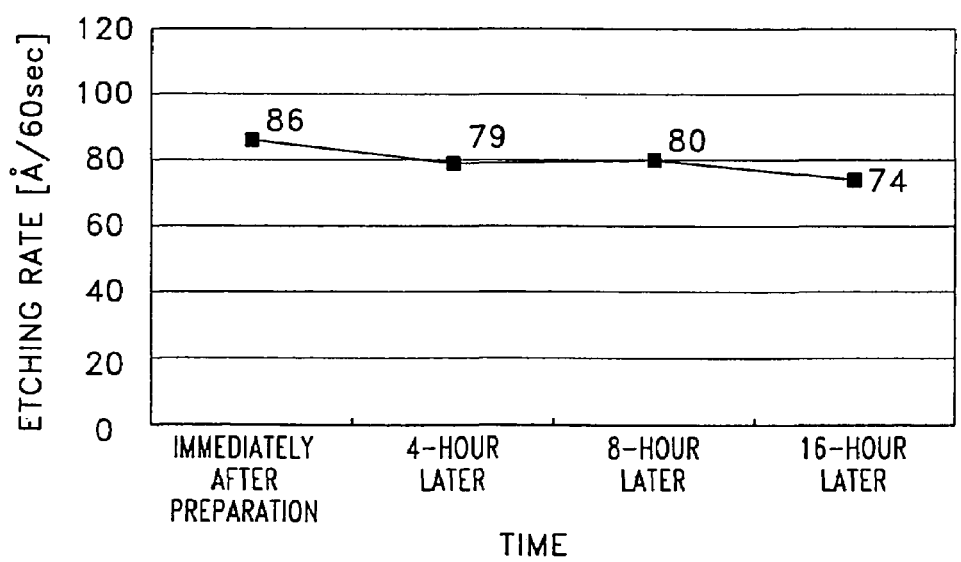
FIG. 5 is an exemplary graph showing etching rate variations of the cleaning solution according to the present invention over time, which were measured to determine a lifetime of the cleaning solution.

As shown in FIG. 5, even after 16 hours have passed from the preparation of the S.C.S, the cleaning capability of the inventive S.C.S. remains consistent. In other words, the S.C.S. according to the present invention has a longer lifetime.

EXPERIMENTAL EXAMPLE 5

Measurement of Cleaning Capability with a Device

After depositing an oxide layer over a substrate, an indium (In) oxide layer and a platinum (Pt) layer were formed in sequence as lower electrode conductive layers and deposited in sequence over the oxide layer. Next, an In oxide layer and an iridium (Ir) layer, which serve as upper electrode conductive layers, were deposited over the resultant structure, and dry etched using a gas mixture including a halogen gas, thereby resulting in 7 FRAM capacitors. One FRAM capacitor was cleaned using a conventional cleaning solution containing methanol and HF as a control sample, and the other six FRAM capacitors were separately cleaned using an S.C.S. according to the present invention. The cleaning time with the S.C.S. was varied at 60, 90 and 120 seconds. Two FRAM capacitors (A and B) were cleaned at each cleaning time. Remnant polarization and leakage current properties of the capacitors were measured after the cleaning was completed. The results are shown in FIGS. 6 and 7.

Figure 6:
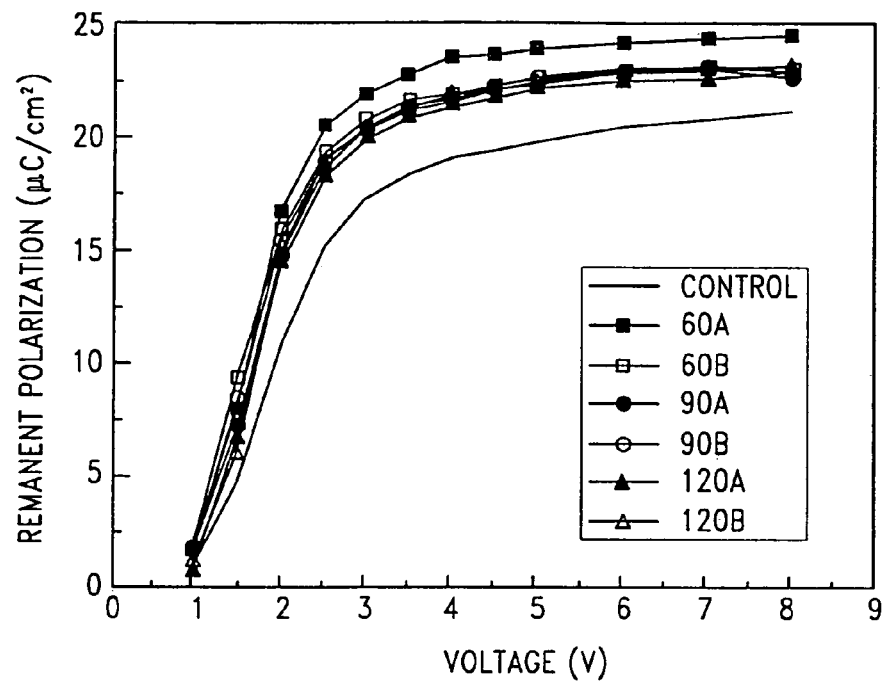
FIG. 6 is an exemplary graph showing remnant polarization in a FRAM capacitor after a conventional cleaning solution and the inventive cleaning solution is applied to sidewalls of the FRAM capacitor.
Figure 7:
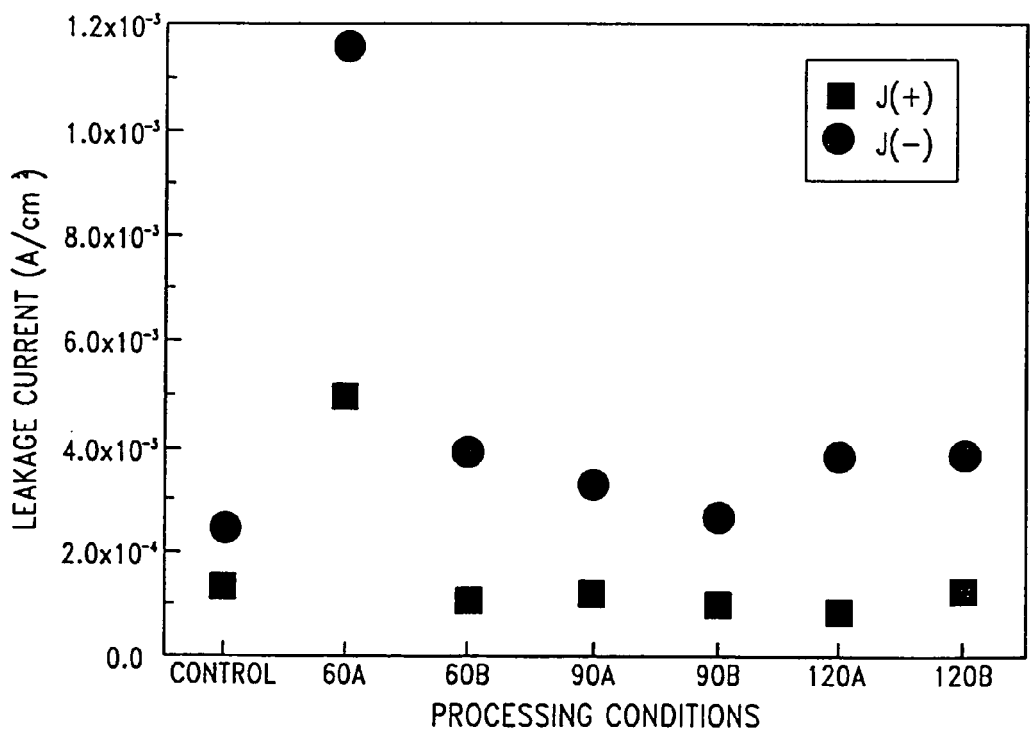
FIG. 7 is an exemplary graph showing a leakage current characteristic of a FRAM capacitor after the conventional cleaning solution and the inventive cleaning solution are each applied to the sidewalls of the FRAM capacitor.

As shown in FIG. 6, capacitance of the FRAM capacitors can be improved with the inventive S.C.S. by about 20%, compared to the case of using the conventional cleaning solution. FIG. 7 shows that the leakage current properties of the FRAM capacitors treated with the S.C.S., exclusive of the FRAM capacitors cleaned for 60 seconds, are similar to those of the FRAM capacitor treated in the conventional cleaning solution.

As previously described, an S.C.S. according to the present invention is able to effectively remove a damaged portion of a ferroelectric layer, and does not corrode or damage electrode layers. Thus, by utilizing the inventive S.C.S. in the manufacture of a FRAM capacitor, electrical properties, such as leakage current and capacitance, of the FRAM capacitor can be improved. In addition, the inventive S.C.S. does not contain a highly volatile alcoholic solvent, and thus its lifetime is prolonged. Furthermore, because the inventive S.C.S. is aqueous, a single rinsing process with deionized water is sufficient to completely remove the inventive S.C.S. when it is used to remove a damaged ferroelectric layer. Thus, a rinsing process with isopropyl alcohol, which is required when using a conventional cleaning solution, is unnecessary in the case of using the inventive S.C.S.

Although illustrative embodiments of the present invention have been described herein with reference to the accompanying drawings, it is to be understood that the present invention is not limited to those precise embodiments, and that various other changes and modifications may be affected therein by persons ordinarily skilled in the art without departing from the scope or spirit of the invention. All such changes and modifications are intended to be included within the scope of the invention as defined by the appended claims.

What is claimed is:

1. A method of cleaning an integrated circuit having a ferroelectric layer, the method comprising:
   providing an integrated circuit substrate having an exposed ferroelectric layer with a damage portion; and
   selectively removing a damaged portion of the exposed ferroelectric layer with a cleaning solution by contacting the exposed ferroelectric layer with said cleaning solution, wherein said cleaning solution comprises a fluoride, an organic acid having a carboxyl group, an alkaline pH adjusting agent, and water.

2. The method of claim 1, wherein the exposed ferroelectric layer includes a surface of the ferroelectric layer passed through annealing after deposition on the integrated circuit substrate, and the step of contacting the exposed ferroelectric layer with said cleaning solution includes etching back the ferroelectric layer by about 100 Å to about 500 Å from a top portion of the ferroelectric layer.

3. The method of claim 1, wherein the exposed ferroelectric layer is interposed between upper and lower electrode layers, and the method further comprises forming a capacitor by patterning the upper electrode layer, the ferroelectric layer and the lower electrode layer, before contacting the exposed ferroelectric layer with said cleaning solution.

4. The method of claim 1, wherein the pH of the cleaning solution is greater than 5 to about 6.0.

5. The method of claim 1, wherein the fluoride is hydrogen fluoride, hydroboron tetrafluoride or ammonium fluoride.

6. The method of claim 1, wherein the organic acid is formic acid, acetic acid or citric acid.

7. The method of claim 1, wherein the alkaline pH adjusting agent is ammonium hydroxide, potassium hydroxide, tetramethylammonium hydroxide or tetraethylammonium hydroxide.

8. The method of claim 1, wherein the content of the fluoride is about 0.01% to about 1% by weight based on the total weight of said cleaning solution.

9. The method of claim 1 wherein the content of the organic acid with carboxyl group is about 1% to about 50% by weight based on the total weight of said cleaning solution.

10. The method of claim 1, wherein the content of the alkali pH adjusting agent is about 0.25% to about 15% by weight based on the total weight of said cleaning solution.

11. A method of cleaning an integrated circuit, the method comprising:
providing an integrated circuit having an exposed ferroelectric layer; and
selectively removing a damaged portion of the exposed ferroelectric layer with a cleaning solution by contacting the exposed ferroelectric layer with said cleaning solution, wherein said cleaning solution comprises a fluoride, an organic acid having a carboxyl group, an alkaline pH adjusting agent, and water, and wherein the organic acid dissolves a reduced metallic component of the ferroelectric layer.

12. The method of claim 11, further comprises the step of:
depositing and annealing the ferroelectric layer prior to selectively removing the damage portion of the ferroelectric layer.

13. The method of claim 11, wherein the step of selectively removing the damage portion of the ferroelectric layer includes removing a semi-stable pyrochlore structure that appears from a top portion of the ferroelectric layer to a predetermined depth.

14. The method of claim 11, wherein the pH of the cleaning solution is greater than 5 to about 6.0.

15. The method of claim 11, wherein contacting the exposed ferroelectric layer with said cleaning solution includes the exposed ferroelectric layer in contact with said cleaning solution for about 30 to about 600 seconds such that the damaged portion of the ferroelectric layer is completely removed.

16. The method of claim 11, wherein the exposed ferroelectric layer includes a surface of the ferroelectric layer passed through annealing after deposition on the integrated circuit substrate, and the step of contacting the exposed ferroelectric layer with said cleaning solution includes etching back the ferroelectric layer by about 100 Å to about 500 Å from a top portion of the ferroelectric layer.

17. The method of claim 11, wherein the exposed ferroelectric layer is interposed between upper and lower electrode layers, and the method further comprises forming a capacitor by patterning the upper electrode layer, the ferroelectric layer and the lower electrode layer, before contacting the exposed ferroelectric layer with said cleaning solution.

18. The method of claim 11, wherein the fluoride is hydrogen fluoride, hydroboron tetrafluoride, or ammonium fluoride.

19. The method of claim 11, wherein the organic acid is formic acid, acetic acid, or citric acid.

20. The method of claim 11, wherein the alkaline pH adjusting agent is ammonium hydroxide, potassium hydroxide, tetramethylammonium hydroxide, or tetraethylammonium hydroxide.

21. The method of claim 11, wherein the content of the fluoride is about 0.01% to about 1% by weight based on the total weight of said cleaning solution.

22. The method of claim 11, wherein the content of the organic acid with carboxyl group is about 1% to about 50% by weight based on the total weight of said cleaning solution.

23. The method of claim 11, wherein the content of the alkali pH adjusting agent is about 0.25% to about 15% by weight based on the total weight of said cleaning solution.

24. The method of claim 11, wherein the ferroelectric layer is formed of a STO, a BST, a PZT, or a PLZT layer.

* * * * *